(12) United States Patent
Bell (10) Patent No.: US 7,072,433 B2
(45) Date of Patent: Jul. 4, 2006

(54) DELAY LOCKED LOOP FINE TUNE

(75) Inventor: Debra M. Bell, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 668 days.

(21) Appl. No.: 09/903,245

(22) Filed: Jul. 11, 2001

(65) Prior Publication Data

US 2003/0012320 A1    Jan. 16, 2003

(51) Int. Cl.
*H03L 7/06* (2006.01)
*H04L 5/00* (2006.01)
*H04L 7/00* (2006.01)
*H04L 9/00* (2006.01)
*H03D 3/24* (2006.01)

(52) U.S. Cl. ............... 375/376; 327/158; 375/156; 713/401

(58) Field of Classification Search ........... 375/354, 375/362, 372–376; 370/516, 517; 331/25; 327/158, 156, 278, 188
See application file for complete search history.

(56) References Cited

U.S. PATENT DOCUMENTS

| | | | |
|---|---|---|---|
| 5,109,394 A | 4/1992 | Hjerpe et al. ............. 375/119 |
| 5,355,037 A | 10/1994 | Andresen et al. ........... 307/602 |
| 5,440,515 A * | 8/1995 | Chang et al. ............. 365/194 |
| 5,604,775 A | 2/1997 | Saitoh et al. ............. 375/376 |
| 5,744,991 A | 4/1998 | Jefferson et al. ........... 327/158 |
| 5,963,069 A | 10/1999 | Jefferson et al. ........... 327/158 |
| 6,049,239 A | 4/2000 | Eto et al. .................... 327/158 |
| 6,069,506 A | 5/2000 | Miller, Jr. et al. .......... 327/156 |
| 6,075,415 A | 6/2000 | Milton et al. ............... 331/25 |
| 6,101,197 A * | 8/2000 | Keeth et al. ............... 370/517 |
| 6,130,552 A | 10/2000 | Jefferson et al. ............ 326/39 |
| 6,297,680 B1 * | 10/2001 | Kondo ...................... 327/278 |
| 6,445,231 B1 * | 9/2002 | Baker et al. ............... 327/158 |
| 6,765,976 B1 * | 7/2004 | Oh ............................ 375/376 |
| 2002/0064082 A1 * | 5/2002 | Maruyama ................. 365/233 |

\* cited by examiner

*Primary Examiner*—Stephen Chin
*Assistant Examiner*—Linda Wong
(74) *Attorney, Agent, or Firm*—Schwegman, Lundberg, Woessner & Kluth, P.A.

(57) ABSTRACT

A digital delay locked loop (DLL) includes a coarse delay segment and fine delay segment. The coarse delay segment includes a coarse delay range. The fine delay segment includes a fine delay range. The coarse delay segment and the fine delay segment apply a coarse delay and a fine delay to an external clock signal to generate an internal clock signal. To keep the external and internal clock signals synchronized, the DLL adjusts the fine delay or coarse delay by increasing or decreasing the fine delay or the coarse delay. The coarse delay is adjusted only when the fine delay is at a minimum or maximum delay of the fine delay range and an increase or decrease in delay is needed respectively.

44 Claims, 7 Drawing Sheets

DELAY LOCKED LOOP FINE TUNE

This application is related to application Ser. No. 09/585,035, filed Jun. 1, 2000.

TECHNICAL FIELD OF THE INVENTION

The present invention relates to signal generation in integrated circuits, and in particular to signal generation using a delay locked loop.

BACKGROUND OF THE INVENTION

Delay locked loops (DLLs) are often used in integrated circuits (ICs) to generate an internal clock signal. The internal clock signal is generated by applying a delay to a system clock or an external clock signal. The DLL automatically adjusts the delay to keep the internal and external clock signals synchronized.

A conventional DLL includes a delay line. The delay line includes a number of delay stages to apply an amount of delay to an external clock signal to generate an internal clock signal. A phase detector compares the phase difference between the external and internal clock signals. If the external and internal signals are not synchronized, the phase detector generates shifting signals. A shift register connected to the delay lines receives the shifting signals to adjust the amount of delay applied to the external clock signal. The phase comparison and delay adjustment process repeats until the external and internal and clock signals are synchronized. When the external and internal and clock signals are synchronized, the phase detector disables the shifting signal to lock the DLL.

In each delay adjustment in a conventional DLL, the delay applied by the delay line is increased or decreased by a delay of one delay stage of the delay line. Thus, after each delay adjustment, the phase difference between the external and internal clock signals become narrower. In other words, after each delay adjustment, the internal clock signal comes closer to an allowable window that indicates the synchronism between the external and internal clock signals. In some cases, the internal signal may miss the window, i.e., overshoot or undershoot the target delay, and therefore a subsequent adjustment step is unnecessarily created. Moreover, adjusting the delay by a delay stage of the delay line may not provide satisfactory level of accuracy especially if the DLL is used in new generations of high speed devices such as microprocessor and dynamic random access memory (DRAM) devices.

For the reasons stated above, and for other reasons stated below which will become apparent to those skilled in the art upon reading and understanding the present specification, there is a need in the art for an improved DLL.

SUMMARY OF THE INVENTION

The present invention includes a DLL that generates an internal clock signal by delaying an external clock signal with a coarse delay and a fine delay. The coarse delay includes a number of coarse unit delays within a coarse delay range; the fine delay includes a number of fine unit delays within a fine delay range. A fine unit delay is smaller than a coarse unit delay. To keep the external and internal clock signals synchronized, the DLL adjusts the fine delay then the coarse delay by increasing or decreasing the numbers of fine unit delays and coarse unit delays. The coarse delay is adjusted only when the fine delay is at a minimum or maximum delay of the fine delay range and an increase or decrease in delay is needed respectively. Since the fine unit delay is smaller than the coarse unit delay, adjusting the fine delay before adjusting the coarse delay reduces the chance of overshoot or undershoot a target delay. Therefore, the accuracy of the timing relationship between external and internal clock signals is improved.

In one aspect, the DLL includes a coarse delay segment connected to a fine delay segment. The coarse delay segment applies a coarse delay to an external clock signal to generate a coarse delayed signal. The fine delay segment applies a fine delay to the coarse delayed signal to generate an internal clock signal. The fine delay segment adjusts the fine delay based on shifting signals that are generated when the external and internal signals are not synchronized. The coarse delay adjusts the coarse delay based on the shifting signals and the fine delay applied to the coarse delay signal.

In another aspect, a method of generating a clock signal is provided. The method includes delaying an external clock signal with a coarse delay to generate a coarse delayed signal. The coarse delayed signal is delayed by a fine delay to generate an internal clock signal. When the external and internal clock signals are not synchronized, shifting signals are generated. The method also includes adjusting the fine delay based on the shifting signals. The method further includes adjusting the coarse delay based on both the shifting signals and the fine delay. The coarse and fine delays are adjusted until the external and internal clock signals are synchronized.

DETAILED DESCRIPTION OF THE INVENTION

The following detailed description refers to the accompanying drawings which form a part hereof, and which is shown, by way of illustration specific embodiments in which the invention may be practiced. These embodiments are described in sufficient detail to enable those skilled in the art to practice the invention, and it is to be understood that other embodiments may be utilized and that logical, mechanical and electrical changes may be made without departing from the spirit and scope of the present invention. The following detailed description is, therefore, not to be taken in a limiting sense, and the scope of the invention is defined only by the appended claims.

Figure 1:
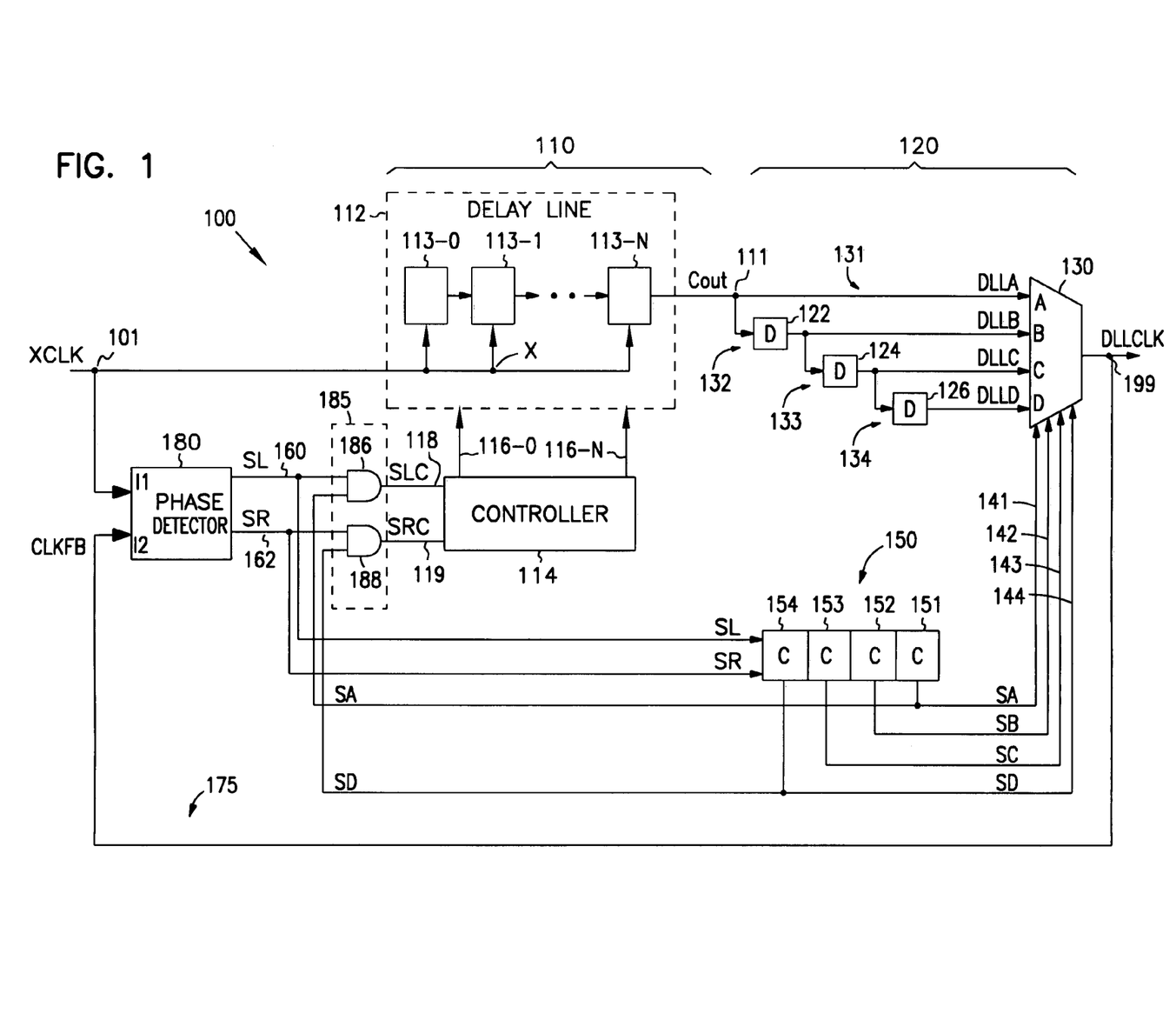
FIG. 1 is diagram of a DLL according to one embodiment of the invention.

FIG. 1 is a diagram of a digital DLL 100 according to one embodiment of the invention. DLL 100 includes an input at node 101 and an output at node 199. Input 101 receives an external clock signal XCLK and output 199 provides an internal clock signal DLLCLK. DLL 100 also includes a coarse delay segment 110, a fine delay segment 120, a feedback path 175, a phase detector 180 and a logic circuit 185.

Coarse delay segment 110 includes an input connected to node 101 to receive the XCLK signal. The XCLK signal is provided to a delay line 112. Delay line 112 includes a plurality of delay stages 113-0 to 113-N. Each of the delay stages provides a delay (delay time). In one embodiment, the delay of each of the delay stages is about 200 picoseconds. However, in some other embodiments, the delay of each of the delay stages can be different. In the embodiment represented by FIG. 1, coarse delay segment 110 provides a smallest or minimum delay equal to the delay of one delay stage (or 200 picoseconds) and a largest or maximum delay equal to the delay of one delay stage (200 picoseconds) multiplied by the total number of delay stages (N). In other words, coarse delay segment 110 includes a coarse delay range with a minimum delay equal to one delay stage and a maximum delay equal to the product of the total number of the delay stages and the delay of one delay stage.

Delay line 112 connects to a controller 114 through a plurality of control taps 116-0 to 116-N. Controller 114 receives a coarse shift left signal SLC on line 118 and a coarse shift right signal SRC on line 119. The SLC and SRC signals are also referred to as coarse adjusts signals. Based on the SLC and SRC signals, controller 114 adjust an amount of coarse delay applied to the XCLK signal by delay line 112 to provide a coarse delayed signal Cout at output node 111. Controller 114 adjusts the coarse delay by increasing or decreasing the delay applied to the XCLK signal.

Figure 2:
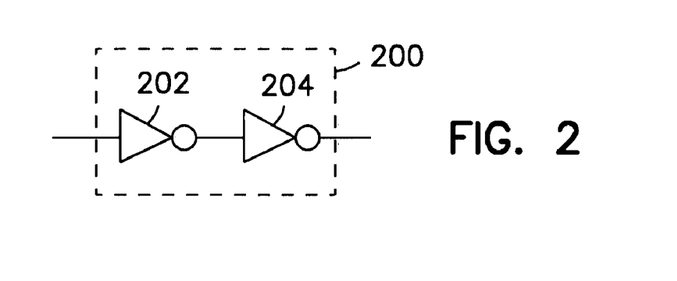
FIG. 2 is diagram of a delay element of the DLL of FIG. 1

Fine delay segment 120 connects to coarse delay segment 110 at node 111 to receive the Cout signal. Fine delay segment 120 includes a plurality of fine delay elements (D) 122, 124 and 126 connected in a cascading fashion to form a plurality fine delay paths 131, 132, 133 and 134. In the embodiment represented by FIG. 1, each of the fine delay elements 122, 124 and 126 is represented by delay element 200 shown in FIG. 2 which includes two inverters 202 and 204 connected in series. Fine delay segment 120 further includes a selector or multiplexor (MUX) 130, and a shift register 150.

Fine delay paths 131, 132, 133 and 134 connect to a common input at node 111 to receive the same Cout signal. Fine delay paths 131, 132, 133 and 134 apply unequal amounts of delay to the Cout signal to generate a plurality of fined delay signals DLLA, DLLB, DLLC and DLLD. The fine delayed signals DLLA, DLLB, DLLC and DLLD have different phase shifts. In other words, because each of the fine delay paths 131, 132, 133 and 134 delays the Cout signal with a different amount of delay, the DLLA, DLLB, DLLC and DLLD do not have the same phase.

Delay path 131 includes an output A, which provides the DLLA signal. Delay path 132 includes delay element 122 and an output B, which provides the DLLB signal. Delay path 133 includes delay elements 122 and 124 and an output C, which provides the DLLC signal. Delay path 134 includes delay elements 122, 124 and 126 and an output D, which provides the DLLD signal. In the embodiment represented by FIG. 1, each of the delay elements 122, 124 and 126 includes a delay (delay time) of about 50 picoseconds, which is smaller than the delay of each of the delay stages 113 0-N of delay line 112 (200 picoseconds). In some other embodiments, each of the delay elements includes a delay that is different than 50 picoseconds.

In the embodiment represented by FIG. 1, delay path 131 does not include a delay, thus, delay path 131 provides zero delay. Delay path 134 includes three delay elements with 50 picosecond delay provided by each delay element, thus, delay path 134 provides 150 picosecond delays (3×50 picoseconds). Therefore, fine delay segment 120 provides a smallest or minimum delay equal to zero and a largest or maximum delay equal to the delay of one delay element multiplied by the number of delay elements of the fine delay path that has the most delay elements. In other words, fine delay segment 120 includes a fine delay range with a minimum delay equal to zero and a maximum delay equal to the product of the delay of one delay element and the number of delay elements of the fine delay path that has the most delay elements. For example, in the embodiment represented by FIG. 1, the delay path that has the most delay elements is delay path 134, which has 3 delay elements (122, 124 and 126). Therefore, the largest or maximum delay of fine delay 120 is 150 picoseconds (50 ps×3). In comparison with coarse delay segment 110, a smallest delay of coarse delay segment 110 is 200 picoseconds (delay of one delay stage). Therefore, the maximum delay of fine delay segment 120 (150 picoseconds) is smaller than the minimum delay or the delay of one delay stage of coarse delay segment 110 (200 picoseconds).

MUX 130 connects to delay paths 131, 132, 133 and 134 at the outputs A, B, C and D to receive the DLLA, DLLB, DLLC, and DLLD signals. MUX 130 also connects to a plurality of select lines 141, 142, 143 and 144 to receive a plurality of select signals SA, SB, SC and SD. MUX 130 selects one of the fine delay signals DLLA, DLLB, DLLC, and DLLD in response to one of the select signals SA, SB, SC and SD and provides the selected fine delayed signal to output 199 as the DLLCLK signal.

A shift register 150 connects to select lines 141, 142, 143 and 144 to provide the select signals SA, SB, SC and SD to MUX 130. Shift register 150 includes a plurality of register cells (C) 151, 152, 153 and 154. Each of the register cells 151–154 holds a logic value such as logic 0 or logic 1. Each of the register cells 151–154 includes an output connected to one of the select lines 141, 142, 143 and 144 to provide one of the SA, SB, SC and SD signals. Shift register 150 receives shifting signals, generated by phase detector 180, on lines 160 and 162. The shifting signals includes a shift left signal (SL) provided on line 160 and a shift right signal (SR) provided on line 162.

Shift register 150 can be a conventional type bidirectional shift register. That means the shift register is capable of shifting and rotating the content of the register cells right and left. In the embodiment represented by FIG. 1, shift register 150 is initially set such that the content of register cell 151 is rotated to replace the content of register cell 154 when shift register 150 performs a shift right; and the content of register cell 154 is rotated to replace the content of register cell 151 when shift register 150 performs a shift left. Shift register 150 is also initially set such that only one of the register cells holds a logic 1, all other register cells hold a logic 0. For example, only register cell 153 is set to logic 1; other register cells 151, 152 and 154 are set to logic 0. In addition, when a register cell holds a logic 1, the signal at its output is asserted with a high signal level (HIGH). When a register cell holds a logic 0, the signal at its output is asserted with a low signal level (LOW).

Phase detector 180 includes a first input I1 and a second input I2. Input I1 connects to node 101 to receive the XCLK signal; input I2 connects to a feedback path 175 to receive a feedback signal CLKFB. In the embodiment represented by FIG. 1, feedback path 175 connects to node 199 to receives the DLLCLK signal and provides it as the CLKFB signal to input I2 of phase detector 180. Phase detector 180 also includes outputs connected to lines 160 and 162 to provide the shifting signals SL and SR. The SL and SR signals are provided to shift register 150. The SL and SR signals are also provided to a logic circuit 185.

Logic circuit 185 includes a first AND gate 186 and a second AND gate 188. AND gate 186 includes inputs connected to line 160 and 141 to receive the SL and SA signals. An output of AND gate 186 connects to line 118 to provides the SLC signal. AND gate 188 includes inputs connected to line 162 and 144 to receive the SR and SD signals. An output of AND gate 188 connects to line 119 to provides the SRC signal. The SLC and SRC signals are provided to controller 114. When the SLC or SRC signal is activated, i.e., HIGH, controller 114 of coarse delay segment 110 causes delay line 112 to adjust the coarse delay. When the SLC or SRC is not activated, i.e., LOW, coarse delay segment 110 remains at its current state or idling.

Coarse delay segment 110 adjusts the coarse delay by increasing or decreasing the coarse delay by one coarse unit delay at a time. In FIG. 1, delay line 112 includes a plurality of delay stages 113 0-N. Each of the delay stages provides the same delay. Therefore, when coarse delay segment 110 adjusts the coarse delay by adding or removing one delay stage from the external clock path (from node 101 to node 111), the coarse delay is increased or decreased by a delay equal to the delay of one delay stage. In other words, the coarse unit delay of coarse delay segment 110 is equal to the delay of one delay stage of coarse delay segment 110.

Fine delay segment 120 adjusts the fine delay by increasing or decreasing the fine delay by one fine unit delay at a time. In FIG. 1, each of the delay paths 132, 133 and 134 includes a different number of delay elements. The number of delay elements between two adjacent fine paths differs by one delay element. Therefore, when fine delay segment 120 adjusts the fine delay by selecting one of the delay paths, the fine delay is increased or decreased by a delay equal to a delay of one delay element. In other word, the fine unit delay of fine delay segment 120 is equal to the delay of one delay element of fine delay segment 120.

In summary, fine delay segment 120 adjusts the fine delay by increasing or decreasing the fine delay one fine unit delay at a time. Coarse delay segment 110 adjusts the coarse delay by increasing or decreasing the coarse delay one coarse unit delay at a time. The delay of the fine unit delay is equal to a delay of one delay element of fine delay segment 120. The delay of the coarse unit delay is equal to a delay of one delay stage of coarse delay segment 110. The delay of the delay element is smaller than the delay of the delay stage. Therefore, the delay of the fine unit delay is smaller than the delay of the coarse unit delay.

It is noted that the terms "earlier" (or leads) and "later" (or lags) are used in describing the rising edge of the XCLK signal in relation to the rising edge of the DLLCLK signal. These terms, however, are only used in a relative sense. That is assuming that both the XCLK and DLLCLK signals have the same reference time in which the rising edge of the XCLK signal is used as the reference. Thus these terms are not absolute.

In operation, referring to FIG. 1, the XCLK signal enters delay line 112 at one preset entry point. For example, in FIG. 1, the preset entry point is point X at delay cell 113-1. In some other embodiments, the entry point can be set at any point along delay line 112. After entering point X, the XCLK signal propagates from delay cell 113-1 through a certain number of delay cells and becomes the Cout signal at node 111.

Fine delay segment 120 receives the Cout signal at node 111 and passes it through fine delay paths 131, 132, 133 and 134 to generate the fine delay path signals DLLA, DLLB, DLLC and DLLD. Path 131 passes the Cout signal to its output A as the DLLA signal. Path 132 passes the Cout signal through delay element 122 to generate the DLLB signal at output B. Path 133 passes the Cout signal through delay elements 122 and 124 to generate the DLLC signal at output C. Path 134 passes the Cout signal through delay elements 122, 124 and 126 to generate the DLLD signal at output D. The DLLA, DLLB, DLLC and DLLD signals are provided to MUX 130.

In the embodiment represented by FIG. 1, fine delay segment 120 includes a fine delay range. The delay range has a smallest delay and a largest delay. Path 131 provides the smallest or minimum delay in comparison to the delays provided by other paths 132, 133 and 134. In contrast, path 134 provides the largest or maximum delay in comparison to the delays provided by paths 131, 132 or 133. Therefore, fine delay segment 120 is at a smallest or minimum delay in the delay range when the DLLA signal on path 131 is selected by MUX 130 as the DLLCLK signal. Fine delay segment 120 is at a maximum delay in the delay range when the DLLD signal on path 134 is selected by MUX 130 as the DLLCLK signal.

MUX 130 operates in a fashion such that it only selects one of the DLLA, DLLB, DLLC and DLLD signals and passes the selected signal to node 199 as the DLLCLK signal. Only one of the select signals SA, SB, SC and SD is enabled or activated at a time, i.e., HIGH, to cause MUX 130 to select only one of the DLLA, DLLB, DLLC and DLLD signals. The activation of the SA, SB, SC and SD is controlled by shift register 150. In the embodiment represented by FIG. 1, shift register 150 includes register cells 151–154. Each of the register cells 151–154 includes an output to provide one of the SA, SB, SC and SD signals. Therefore, the activation of the select signals SA, SB, SC and SD depends on outputs of register cells 151–154. The outputs of the register cells are determined by the states or contents of the register cells. As explained earlier, only one of the register cells holds a logic 1 to activate only one of the respective select signals SA, SB, SC and SD to pass one of the DLLA, DLLB, DLLC and DLLD signals to node 199 as the DLLCLK signal.

The DLLCLK signal is provided on feedback line 175 as the feedback signal CLKFB to phase detector 180. Thus, the CLKFB is the same as the DLLCLK signal. Phase detector 180 compares the relative timing between the edges of the XCLK and CLKFB signals. Based on the difference between the edges of the XCLK and CLKFB signals, phase detector 180 generates the SL or SR accordingly. The SL or SR signal is provided to logic circuit 185 and shift register 150 so that coarse delay segment 110 and fine delay segment 120 can adjust the coarse and fine delays to synchronize the XCLK and DLLCLK signals. Fine delay segment 120 adjusts the fine delay based on the SL or SR signal. Coarse delay segment 110, however, adjusts the coarse delay based on a combination of the SL or SR signal and the current state or condition of fine delay segment 120.

Figure 3:
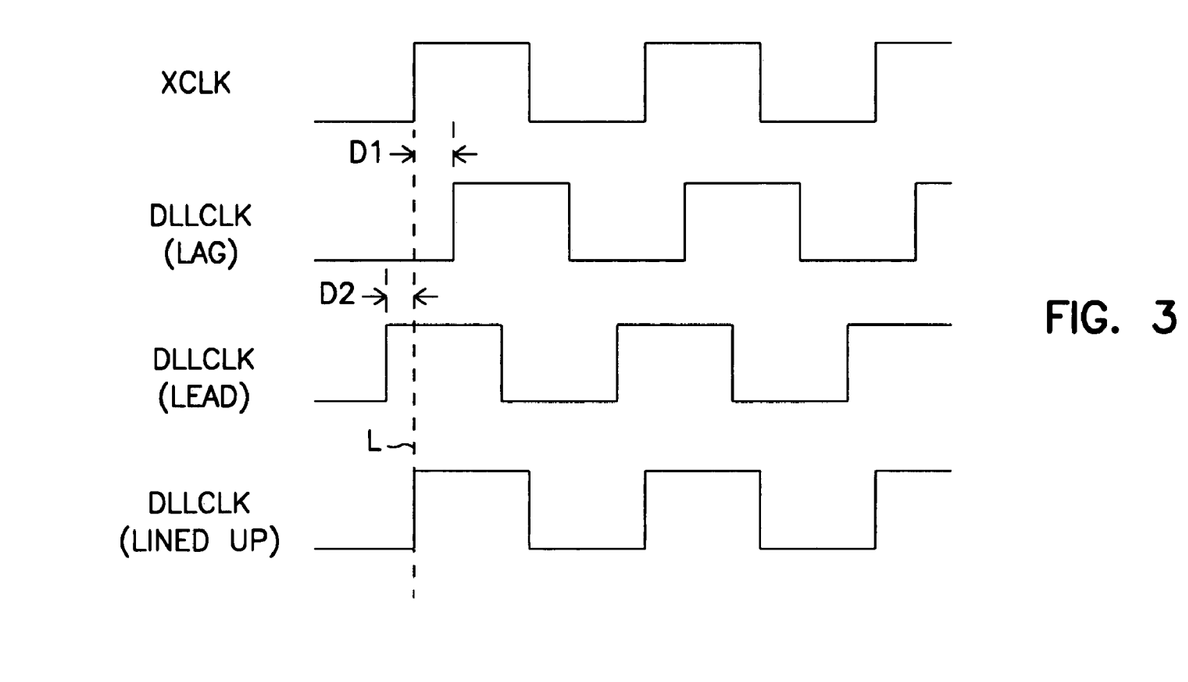
FIG. 3 is diagram showing timing relationship between an external signal and an internal signal of the DLL of FIG. 1.

As a first example, assuming the DLLCLK signal is currently selected from the DLLC signal by MUX 130. This means that the select signal SC is active (or activated) and register cell 153 holds a logic 1. At this point, assume that XCLK and DLLCLK signals are not synchronized. Thus, two possible situations can occur as shown in FIG. 3. In this example, the rising edge of the XCLK signal is leading the rising edge of the DLLCLK signal by a delay D1 as shown in FIG. 3. In this case, after comparing the rising edges of the XCLK and CLKFB (DLLCLK) signals, phase detector 180 generates the SR signal to allow coarse delay segment 110 or fine delay segment 120 to decrease the coarse or fine delay applied to the XCLK or Cout signal. This allows the CLKFB signal to catch up and eventually be synchronized with the XCLK signal.

When shift register 150 receives the SR signal from phase detector 180, it causes each of the register cells 151–154 to shift one position to the right. Thus, logic 1 is shifted from register cell 153 to register cell 152. This disables or deactivates the SC signal at the output of register cell 153 and enables or activates the SB signal at the output of register cell 152. Accordingly, the deactivated SC signal causes MUX 130 to de-select the DLLC signal, and the activated SB signal causes MUX 130 to select the DLLB signal. MUX 130 passes the DLLB signal to node 199 as the (new) DLLCLK signal. By switching from the DLLC signal to the DLLB signal, fine delay segment 120 decreases the fine delay applied to the Cout signal because the DLLB signal is provided by path 132, which has fewer delay elements than path 133, which provides the DLLC signal.

At the same time that fine delay segment 120 is adjusting the fine delay in this example, coarse delay segment 110 does not adjust the coarse delay because the SLC or SRC signal is not active, i.e., is LOW. In the embodiment represented by FIG. 1, one of the inputs of AND gates 186 and 188 connects to the outputs of register cells 151 or 154. In this example, since the signals at both outputs of register cells 151 and 154 are not active or LOW, one of the inputs of AND gates 186 and 188 is also LOW. This forces a LOW to both outputs of AND gates 186 and 188. This means that the SLC and SRC signals are LOW. When the SLC and SRC signals are LOW, coarse delay segment 110 is idling or does not adjust the coarse delay.

After the selection of the DLLB signal as the DLLCLK signal by MUX 130, phase detector 180 repeats the comparison between the XCLK and CLKFB (DLLCLK) signals. If the XCLK signal still leads the DLLCLK signal by a delay, phase detector will again activate the SR signal. This time, shift register 150 and MUX 130 operate in a similar manner as described in the above description. Shift register 150 performs a shift right and shifts the logic 1 from register cell 152 to register cell 151. This causes the register cell 151 to active the SA signal, which enables MUX 130 deselect the DLLB signal and to select the DLLA signal to node 199 as the DLLCLK signal. At this time, since the DLLA signal is selected as the DLLCLK signal, fine delay segment 120 is at the minimum delay.

In the above example, fine delay segment 120 is at the minimum delay. Again, the XCLK and CLKDLL are not synchronized and phase detector 180 activates the SR signal indicating a need to decrease the coarse or fine delay. This time, fine delay segment 120 cannot further decrease the fine delay when it receives the SR signal because it is at the minimum delay. Therefore, when fine delay segment 120 is at the minimum delay and the SR signal (decrease) is activated, the decrease in delay is performed by coarse delay segment 110.

Fine delay segment 120 is at minimum delay when register cell 151 holds the logic 1. When shift register 150 receives the (HIGH) SR signal, it shifts and rotates the logic 1 from register cell 151 to register cell 154. This is a conventional shifting operation associated with conventional bidirectional shift register as known to those skilled in the art. When register cell 154 has the logic 1, it activates the SD signal (HIGH) on line 144. At this time, both of the SR signal on line 162 and the SA on line 144 are HIGH. Since the inputs of AND gate 188 connect to lines 162 and 144, both of the inputs are also HIGH. This forces a HIGH to the output of AND gate 188 at node 119. This means that the SRC signal at node 119 is HIGH. When the SRC is HIGH, it causes controller 114 to cause delay line 112 to adjust the coarse delay by decreasing the coarse delay applied to the XCLK signal.

At the same time coarse delay segment 110 decreases the coarse delay, fine delay segment 120 deselects the DLLA signal and selects the DLLD signal as the DLLCLK signal. This means that fine delay segment 120 is switched from the minimum delay to the maximum delay. In summary, when fine delay segment 120 is at the minimum delay and the decrease or SR signal is activated, fine delay segment 120 sends the select signal SD to coarse delay segment 110. The SD signal, in combination with the SR signal, enables coarse delay segment 110 to decrease the coarse delay. At fine delay segment 120, the DLLD signal selected as the DLLCLK signal. This sets fine delay segment 120 to the maximum delay.

In the first example above, fine delay segment 120 is set to the maximum delay when coarse delay segment 110 switches. However some other embodiments, fine delay segment 120 can also be set to a delay that is different from the maximum delay when coarse delay 110 switches. For instance, fine delay segment 120 can be set to any delay between the minimum and maximum delays of the fine delay range when coarse delay segment 110 switches. To achieve this, shift register 150 shown in FIG. 1 is set or initialized to shift and rotate the content of register cell 151 to any one of the other register cells such as register cell 152 or 153. By initializing shift register 150 this way, when coarse delay segment 110 switches, fine delay segment 120 is set to provide a delay between the minimum and maximum delays or a delay that is different from the maximum delay.

In the first example described above, the XCLK signal is assumed to be leading the DLLCLK signal as indicated by the delay D1 in one of the two possible situations shown in FIG. 3. As a second example, assuming the other situation occurs, i.e., the XCLK signal is lagging the DLLCLK signal by a delay D2 also shown in FIG. 3. In this case, the operation of DLL 100 is similar to its operation in the first example but in an opposite manner. This time, after comparing the rising edges of the XCLK and CLKFB signals, phase detector 180 activates the SL (increase) signal instead of the SR (decrease) signal. This allows coarse delay segment 110 or fine delay segment 120 to increase the coarse or fine delay applied to the XCLK or Cout signal to synchronize the XCLK and DLLCLK signals.

In the second example, shift register 150 shifts the content of register cells 151–154 to the left. The select signals SA, SB, SC and SD are activated in the order starting from SA to SD. Accordingly, MUX 130 selects fine delayed signal DLLA, DLLB, DLLC and DLLD in the order from DLLA to DLLD. When fine delay segment 120 is at the maximum delay, i.e., the DLLD signal is selected as the DLLCLK signal, and the SL (increase) signal is activated, fine delay segment 120 cannot further increase the fine delay. Thus, the increase in delay is perform by coarse delay segment 110.

In an opposite situation from the first example, when fine delay segment 120 is at the maximum delay and the SL signal is activated, the content of register cell 154 (logic 1)

is shifted to register cell 151. After the shift, register cell 151 holds logic 1, thus, the SA signal is activated. At this time, both the SL signal on line 160 and the SA signal on line 141 are HIGH. Since the inputs of AND gate 186 connect to lines 160 and 141, both of the inputs are also HIGH. This forces a HIGH to the output of AND gate 186 at node 118. This means that the SLC signal at node 119 is also HIGH. When the SLC is HIGH, it causes controller 114 to cause delay line 112 to adjust the coarse delay by increasing the coarse delay applied to the XCLK signal.

At the same time coarse delay segment 110 increases the coarse delay, fine delay segment 120 deselects the DLLD signal and selects the DLLA signal as the DLLCLK signal. This means that fine delay segment 120 is switched from the maximum delay to the minimum delay. In summary, when fine delay segment 120 is at the maximum delay and the increase or SL signal is activated, fine delay segment 120 sends the select signal SA to coarse delay segment 110. The SA signal, in combination with the S1 signal, enables coarse delay segment 110 to increase the coarse delay. At fine delay segment 120, the DLLA signal is selected as the DLLCLK signal. This sets fine delay segment 120 to the minimum delay.

In the second example above, fine delay segment 120 is set to the minimum delay when coarse delay segment 110 switches. However, this is not the only option. In some other embodiments, fine delay segment 120 is set to a delay that is different from the minimum delay when coarse delay 110 switches. For instance, fine delay segment 120 can be set to any delay between the minimum and maximum delays of the fine delay range coarse delay segment 110 switches. To achieve this, shift register 150 shown in FIG. 1 can be set or initialized to rotate the content of register cell 154 to any one of the other register cells such as register cell 152 or 153. By initializing shift register 150 this way, when coarse delay segment 110 switches, fine delay segment 120 is set to provide a delay that is between the minimum and maximum delays or a delay that is different from the minimum delay.

Figure 4:
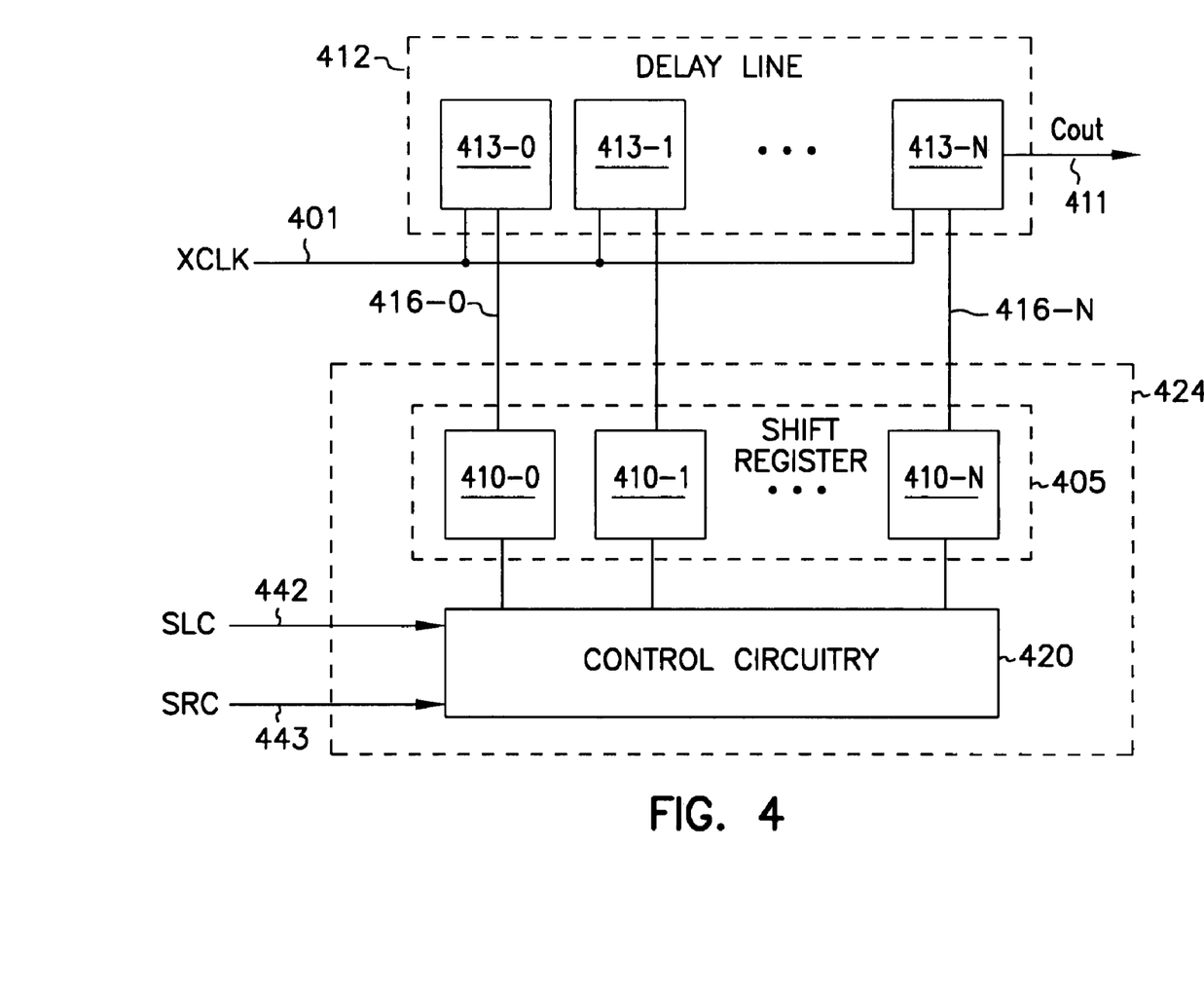
FIG. 4 is a block diagram of a delay line and controller according to one embodiment of the invention

FIG. 4 is a block diagram of a delay line 412 connected to a controller 424 according to one embodiment of the invention. Delay line 412 and controller 424 represent delay line 112 and controller 114 of FIG. 1. Delay line 412 includes a plurality of delay stages 413-0 to 413-N connected to a common input node 401 to receive an external clock signal XCLK. Delay line 412 also includes an output connected node 411 to provide the delayed signal Cout. Controller 424 includes a shift register 405 connected to a register control circuitry 420. Shift register 405 includes a plurality of shift register cells 410-0 to 410-N. Register cells 410-0 to 410-N include a plurality of outputs 416-0 to 416-N, which are shown as control taps 116-0 to 116-N in FIG. 1. The number of shift register cells 410 0-N is equal to the number of delay stages 413-0 to 413-N. Control circuitry 420 connects to lines 442 and 443 to receive the SLC and SRC signals, which are represented by the SLC and SRC signals on line 118 and 119 of FIG. 1.

In operation, register control circuitry 420 receives the SLC or SRC signal provided on line 442 or 443. Based on the SLC or SRC signal, control circuitry 420 causes register cells to select different output lines 416 0-N. Based on the selected output lines, delay line 412 selects a different number of delay cells 413 0-N that the XCLK signal passes through. Thus, the amount of delay applied to the XCLK signal is also changed accordingly. Control circuitry 420 and delay line 412 repeat the process until the XCLK and DLLCLK signals are synchronized.

Figure 5:
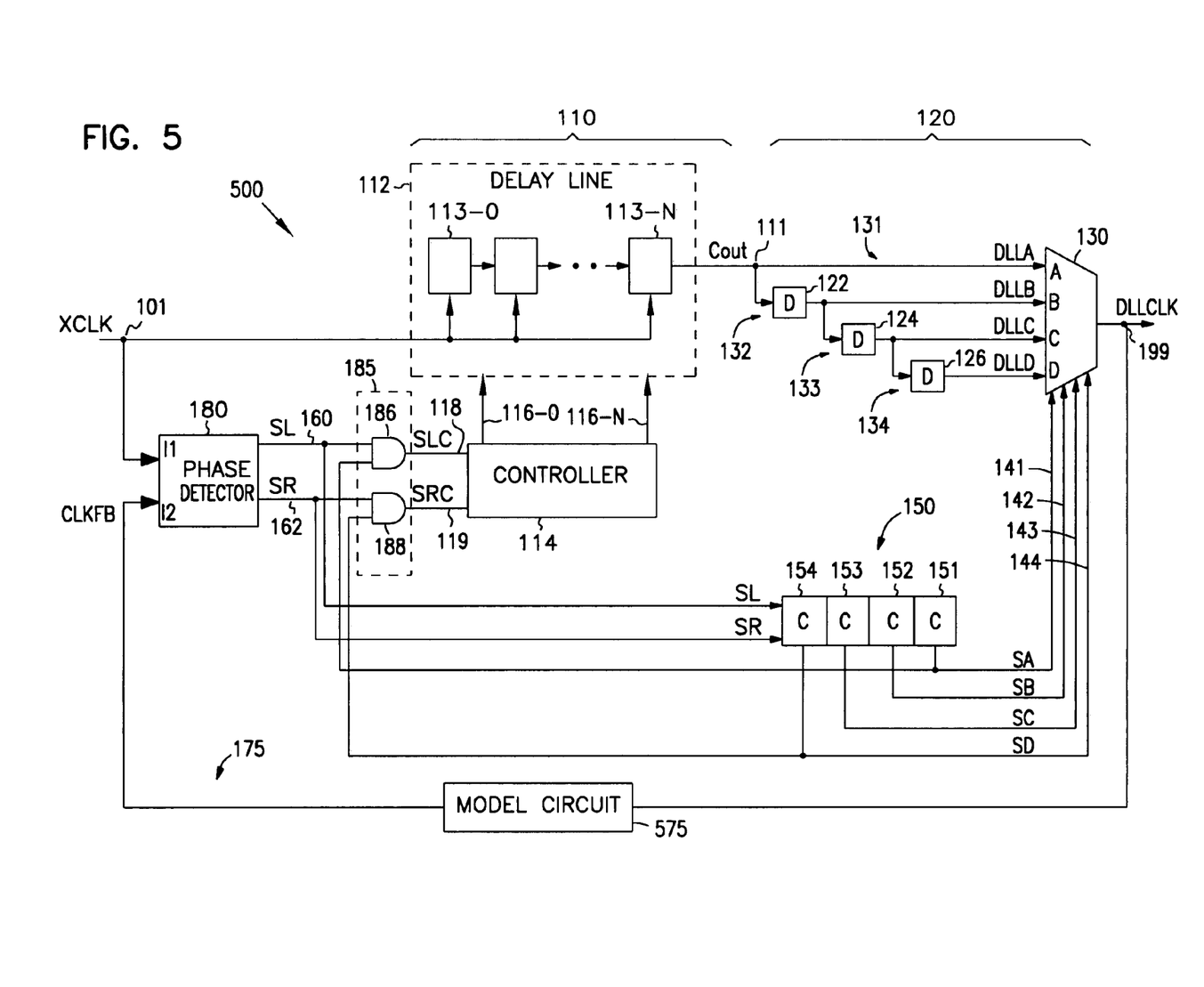
FIG. 5 is diagram of a DLL according to another embodiment of the invention.

FIG. 5 is diagram of DLL 500 according to another embodiment of the invention. DLL 500 is a variation of DLL 100 as shown in FIG. 1. For simplicity same elements in both DLLs have the same reference numbers. In the embodiment represented by FIG. 1, the CLKFB provided by feedback path 175 is the same as the DLLCLK. However, embodiment represented by FIG. 5, DLL 500 includes a model circuit 575, which is inserted in feedback path 175. Model circuit 575 has a delay. Thus, in FIG. 5, the CLKFB signal is not the same as the DLLCLK signal; it is a delayed version of the DLLCLK signal. In some applications, model circuit 575 is a replica or a model of another circuit, which is located inside or outside DLL 500. In some other applications, model circuit 575 is a replica or a model of circuits, which are located inside and outside DLL 500.

Figure 6:
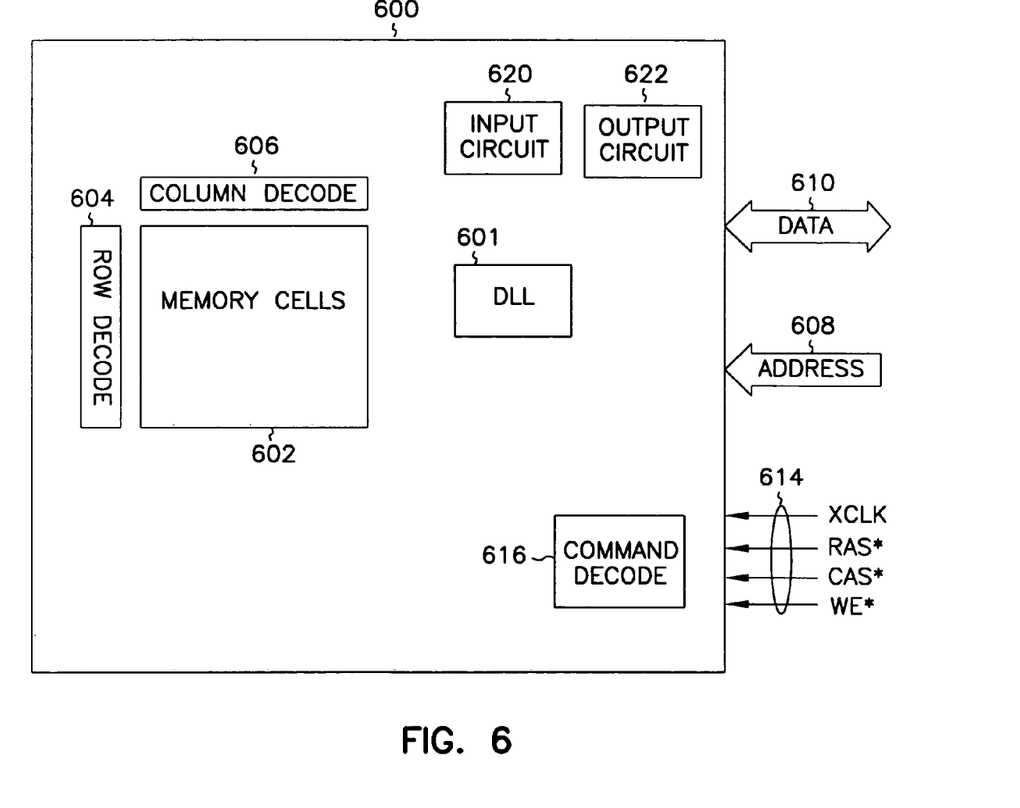
FIG. 6 is diagram memory device according to the invention.

FIG. 6 is a block diagram of a memory device 600 according to one embodiment of the invention. Memory device 600 includes a plurality of memory cells 602 arranged in rows and columns. Row decode circuit 604 and column decode circuit 606 access the rows and columns in response to an address, provided on a plurality of address lines or bus 608. Data is transferred to and from memory device 600 through data lines or bus 610. A command decode circuit 616 controls data communication to and from memory device 600, via input circuit 620 and output circuit 622 in response to input signals on control lines 614. Command decode circuit 616 receives the input signals on lines 614 to determine the modes of operation of memory device 600 such as a read, write, or test mode. The input signals on lines 614 include, but are not limited to, External Clock (XCLK), Row Access Strobe (RAS*), Column Access Strobe (CAS*), and Write Enable (WE*).

In addition, memory device 600 also includes a DLL 601. DLL 601 is similar to DLL 100 and DLL 500 shown in FIGS. 1 and 5. During a memory operation such as a read operation, DLL 601 enables a data signal from memory cells 602 to be captured at output circuit 622 and output to data line 610. At data line 610 the data signal is synchronized with the XCLK signal.

Memory device 600 of FIG. 6 can be a dynamic random access memory (DRAM) or other types of memory circuits such as SRAM (Static Random Access Memory) or Flash memories. Furthermore, the DRAM could be a synchronous DRAM commonly referred to as SGRAM (Synchronous Graphics Random Access Memory), SDRAM (Synchronous Dynamic Random Access Memory), SDRAM II, or DDR SDRAM (Double Data Rate SDRAM), as well as Synchlink or Rambus DRAMs. Those of ordinary skill in the art will readily recognize that memory device 600 of FIG. 6 is simplified to illustrate one embodiment of a memory device of the present invention and is not intended to be a detailed description of all of the features of a memory device.

Figure 7:
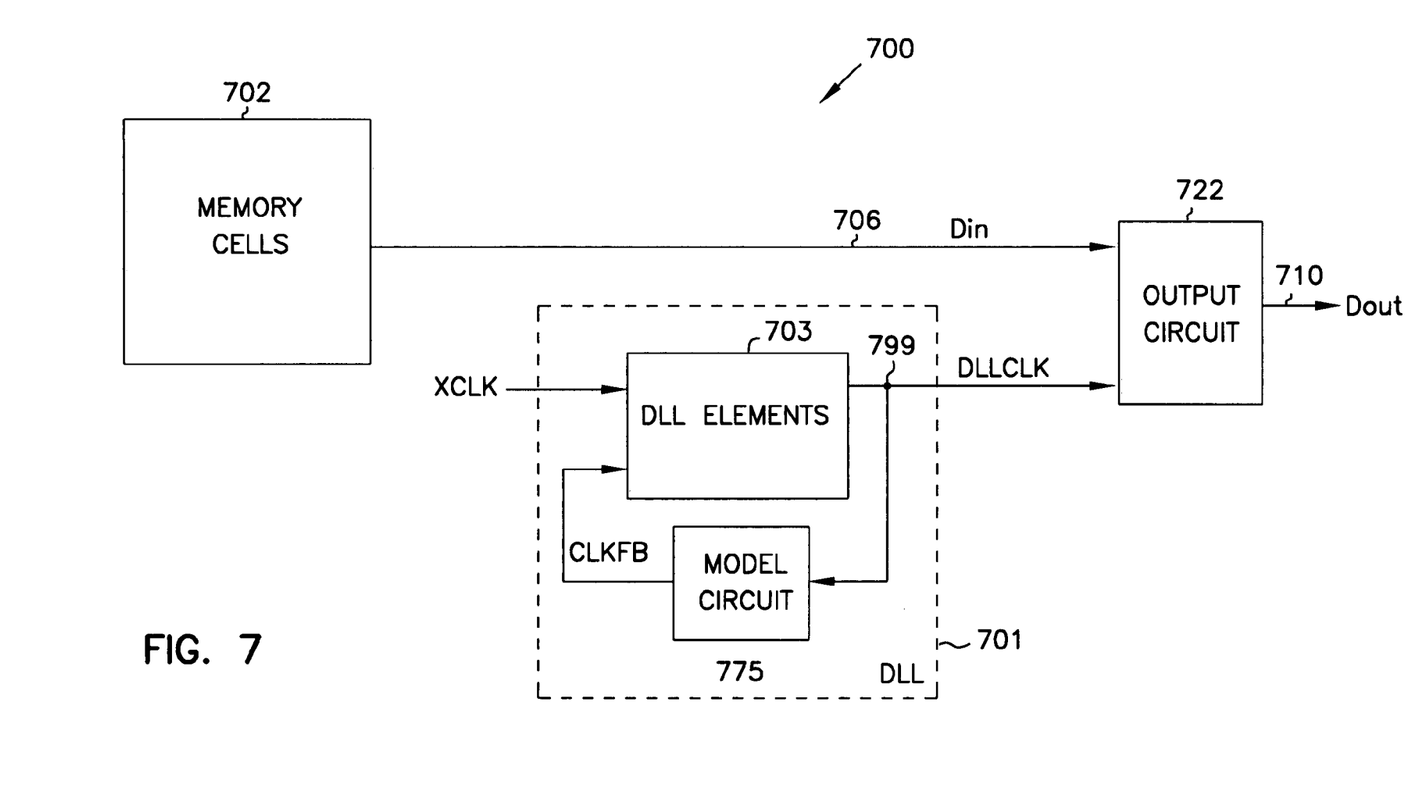
FIG. 7 is diagram showing in more detail a portion of memory device of FIG. 6.

FIG. 7 is diagram showing in more detail a portion of memory device 600 of FIG. 6. In FIG. 7, memory cells 702 and output circuit 722 are similar to memory cells 602 and output circuit 622 of FIG. 6. DLL 701 of FIG. 7 is similar to DLL 500 of FIG. 5. For simplicity, DLL elements such as the coarse and fine segment, the phase detector and the logic circuit shown in FIG. 5 are represented by block 703 in FIG. 7. In FIG. 7, model circuit 775 is identical to output circuit 722. In this arrangement, node 799 is connected output circuit 722 to provide the DLLCLK signal. Node 799 is similar to node 199 of FIG. 5. Output circuit 722 connects to memory cells 702 via line 706 to receive a data signal Din. Output circuit has an output connected to line 710 to generate an output data signal Dout.

In a read operation, the data signal Din read from memory cells 702 is transmitted to output circuit 722. The DLLCLK signal is used as a clock signal to capture the Din signal. Output circuit 722 passes the Din signal to line 710 as the Dout signal. In the embodiment represented by FIG. 7, since model circuit 775 is identical to output circuit 722, a delay of model circuit 775 is the same as a delay of output circuit 722. Thus when model circuit 775 and output circuit 722 receive the same DLLCLK signal, the Dout and CLKFB signals are also the same. When DLL 701 is locked or when the XCLK and CLKFB signal are synchronized, the XCLK and Dout are also synchronized.

Figure 8:
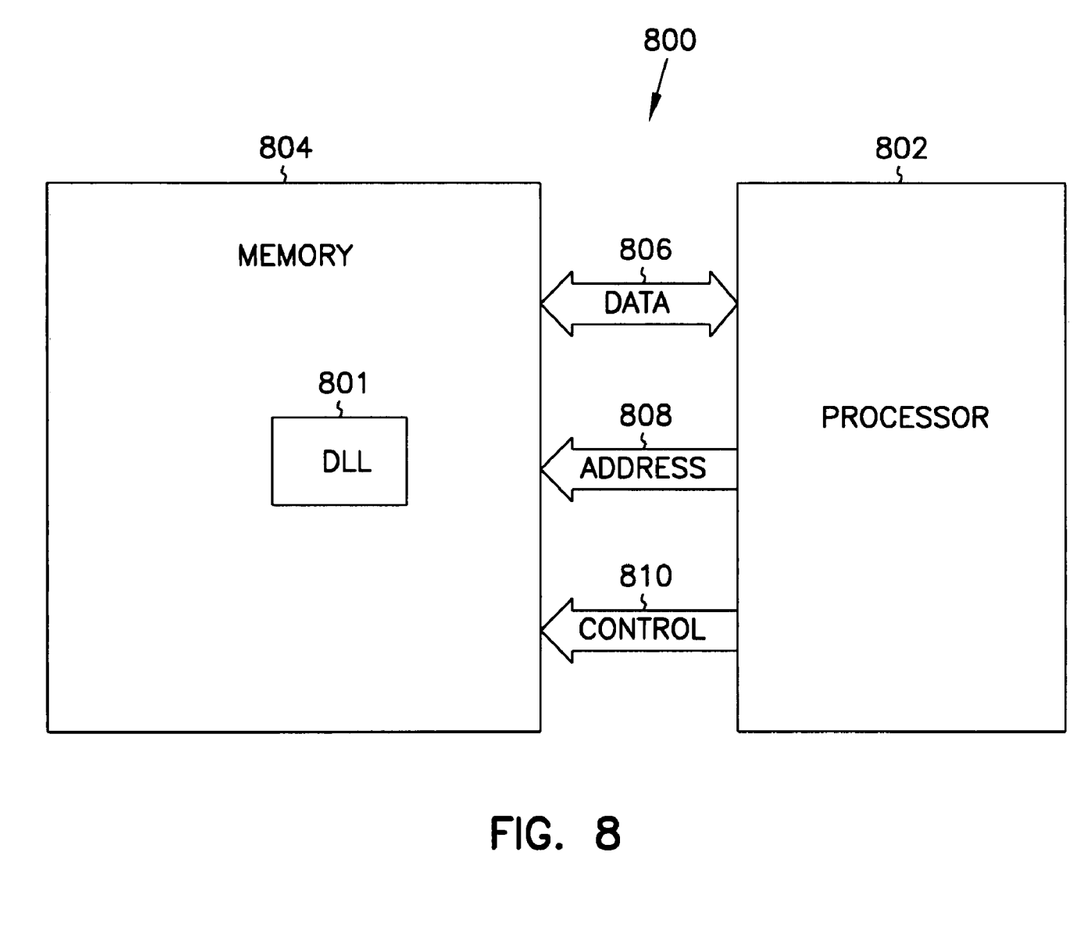
FIG. 8 is diagram of a system according to one embodiment of the invention.

FIG. 8 shows a system 800 according to one embodiment of the invention. System 800 includes a processor 802 and a memory device 804. Memory device 804 represents memory device 600 shown in FIG. 6. Processor 802 can be a microprocessor, digital signal processor, embedded processor, microcontroller, or the like. Processor 802 and memory device 804 communicate using address signals on lines 808, control signals on lines 810, and data signals on lines 806.

Memory device 804 includes a DLL 801. DLL 801 is similar to DLL 100 and DLL 500 as shown in FIGS. 1 and 5. During memory read operation, DLL 801 is used to captured an internal data signal, such as the Din signal shown in FIG. 7. DLL 801 further generates an output data signal such as the Dout signal shown in FIG. 7. The Dout signal is synchronized with the XCLK signal. During the read operation, the Dout signal is sent to processor 802 via data lines 806.

CONCLUSION

A novel delay locked loop (DLL) has been disclosed. The DLL generates an internal clock signal by delaying an external clock signal with a coarse delay and a fine delay. The coarse delay includes a number of coarse unit delays within a coarse delay range; the fine delay includes a number of fine unit delays within a fine delay range. A fine unit delay is smaller than a coarse unit delay. To keep the external and internal clock signals synchronized, the DLL adjusts the fine delay then the coarse delay by increasing or decreasing the numbers of fine unit delays and coarse unit delays. The coarse delay is adjusted only when the fine delay is at a minimum or maximum delay of the fine delay range and an increase or decrease in delay is needed respectively. Since the fine unit delay is smaller than the coarse unit delay, adjusting the fine delay before adjusting the coarse delay reduces the chance of overshoot or undershoot a target delay. Therefore, the accuracy of the timing relationship between external and internal clock signals is improved.

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. Therefore, it is intended that this invention be limited only by the claims and the equivalents thereof.

What is claimed is:

1. A digital delay locked loop comprising:
    a coarse delay segment for applying a coarse delay to an external clock signal to generate a coarse delayed signal;
    a fine delay segment connected to the coarse delay segment for applying a fine delay to the coarse delayed signal to generate an internal clock signal; and
    wherein the fine delay segment is configured for adjusting the fine delay based on a plurality of shifting signals that are generated when the external and internal signals are not synchronized, wherein the coarse delay is configured for adjusting the coarse delay based on a logical combination of the plurality of shifting signals and a plurality of select signals, and wherein the select signals are used to select the fine delay applied to the coarse delay signal.

2. The DLL of claim 1, wherein the coarse delay is within a coarse delay range of the coarse delay segment, wherein the fine delay is within a fine delay range of the fine delay segment, and wherein the fine delay range is smaller than the coarse delay range.

3. The DLL of claim 1, wherein the coarse delay is within a coarse delay range of the coarse delay segment, wherein the fine delay is within a fine delay range of the fine delay segment, wherein a largest delay of the fine delay range is smaller than a smallest delay of a coarse delay range.

4. The DLL of claim 1, wherein the coarse delay segment adjusts the coarse delay only when the fine delay segment applies a minimum delay of a fine delay range of the fine delay segment and the shifting signals indicate a decrease in the delay is necessary.

5. The DLL of claim 1, wherein the coarse delay segment adjusts the coarse delay only when the fine delay segment applies a maximum delay of the fine delay range and the shifting signals indicate an increase in the delay is necessary.

6. The DLL of claim 1, wherein each time the coarse delay segment adjusts the coarse delay, the fine delay segment changes the fine delay to a different delay within a delay range of the fine delay segment.

7. A digital delay locked loop comprising:
    a coarse delay segment for applying a coarse delay to an external clock signal to generate a coarse delayed signal;
    a fine delay segment connected to the coarse delay segment for applying a number of unequal amounts of fine delay to the coarse delayed signal to generate a plurality of fine delayed signals having different phase shifts, the fine delay segment including a selector, the selector responsive to a select signal to select from among the fine delay signals to generate an internal clock signal;
    a phase detector for generating a plurality of shifting signals based on a difference in phase between the external and internal clock signals, wherein the fine delay segment is configured to provide the select signal based on the plurality of shifting signals; and
    a logic circuit responsive to the combination of the plurality of shifting signals and the select signal to enable the coarse delay segment to adjust the coarse delay.

8. The DLL of claim 7, wherein each time the coarse delay segment adjusts the coarse delay, the fine delay segment switches the internal clock signal between a fine delayed signal having a minimum amount of delay and a fine delayed signal having maximum amount of delay within a fine delay range.

9. The DLL of claim 7, wherein each time the coarse delay segment adjusts the coarse delay, the fine delay segment switches the internal clock signal between two fine delayed signals having unequal amounts of delay within a fine delay range.

10. The DLL of claim 7, wherein the coarse segment includes:

a delay line including a plurality of delay stages for applying the coarse delay to the external clock signal, each of the delay stages includes a delay time; and a controller connected to the logic circuit and the delay line, the controller causing the delay line to adjust the coarse delay based on the shifting signals and the select signal.

11. A digital delay locked loop comprising:

a coarse delay segment for applying a coarse delay to an external clock signal to generate a coarse delayed signal, a fine delay segment connected to the coarse delay segment for applying a number of unequal amounts of fine delay to the coarse delayed signal to generate a plurality of fine delayed signals having different phase shifts;

a phase detector for generating shifting signals based on a difference in phase between the external and internal clock signals, wherein the fine delay segment is configured to select one of the fine delay signals based on the shifting signals to provide an internal clock signal; and a logic circuit to receive the shifting signals and a select signal to enable the coarse delay segment to adjust the coarse delay, wherein the coarse segment includes a delay line including a plurality of delay stages for applying the coarse delay to the external clock signal, each of the delay stages includes a delay time, and a controller connected to the logic circuit and the delay line, the controller is configured to enable the delay line to adjust the coarse delay based on the shifting signals and the select signal, and wherein the fine delay segment includes:

a plurality of fine delay paths to receive the coarse delayed signal to provide the plurality of fine delay signals, each of the fine delay paths includes a delay time;

a selector connected to the delay paths to receive the fine delay signals; and a shift register connected to the phase detector and the selector, the shift register receiving the shifting signals to activate the select signal, wherein the selector selects one of the fine delay signals based on the activated select signal to generate the internal clock signal.

12. The DLL of claim 11, wherein the delay time of each of the delay stages of the coarse delay segment is greater than the delay time of each of the fine delay paths.

13. A delay locked loop comprising:

a coarse delay line for applying a coarse delay to an external clock signal to generate a coarse delayed signal;

a plurality of fine delay paths connected to the coarse delay line for applying unequal amounts of fine delay to the coarse delayed signal to generate a plurality of fine delayed signals;

a selector connected to the fine delay paths to select one of the fine delayed signals based on select signals to provide an internal clock signal;

a phase detector to compare the external and internal clock signals to provide shifting signals;

a shift register connected to the phase detector and the selector, the shift register receiving the shifting signals to activate the select signals;

a logic circuit including inputs connected to the shift register and the phase detector to receive the shifting signals and the select signals to provide coarse adjust signals; and a controller connected to the logic circuit to receive the coarse adjust signals to adjust the coarse delay, wherein the coarse controller adjusts the coarse delay and the selector selects the fine delayed signal until the external and internal clock signals are synchronized.

14. The DLL of claim 13, wherein the delay line includes a plurality of delay stages, each of the delay stages includes a delay time, wherein each of the fine delay paths includes a delay time, wherein the delay time of each of the delay stages is greater than the delay time of each of the fine delay paths.

15. A delay locked loop comprising:

a coarse delay line for applying a coarse delay to an external clock signal to generate a coarse delayed signal;

a plurality of fine delay paths connected to the coarse delay line for applying unequal amounts of fine delay to the coarse delayed signal to generate a plurality of fine delayed signals;

a selector connected to the fine delay paths to select one of the fine delayed signals based on select signals to provide an internal clock signal;

a phase detector to compare the external and internal clock signals to provide shifting signals;

a shift register connected to the phase detector and the selector, the shift register receiving the shifting signals to activate the select signals;

a logic circuit including inputs connected to the shift register and the phase detector to receive the shifting signals and the select signals to provide coarse adjust signals; and a controller connected to the logic circuit to receive the coarse adjust signals to adjust the coarse delay, wherein the coarse controller adjusts the coarse delay and the selector selects the fine delayed signal until the external and internal clock signals are synchronized, wherein the coarse delay line includes a plurality of delay stages, each of the delay stages including a delay time, wherein each of the fine delay paths includes a delay time, wherein the delay time of each of the delay stages is greater than the delay time of each of the fine delay paths, and wherein the delay time of each of the delay stages is the same, wherein the delay time of each of the fine delay paths is not the same.

16. A delay locked loop comprising:

a coarse delay line for applying a coarse delay to an external clock signal to generate a coarse delayed signal;

a plurality of fine delay paths connected to the coarse delay line for applying unequal amounts of fine delay to the coarse delayed signal to generate a plurality of fine delayed signals;

a selector connected to the fine delay paths to select one of the fine delayed signals based on select signals to provide an internal clock signal;

a phase detector to compare the external and internal clock signals to provide shifting signals;

a shift register connected to the phase detector and the selector, the shift register receiving the shifting signals to activate the select signals;

a logic circuit including inputs connected to the shift register and the phase detector to receive the shifting signals and the select signals to provide coarse adjust signals; and a controller connected to the logic circuit to receive the coarse adjust signals to adjust the coarse delay, wherein the coarse controller adjusts the coarse delay and the selector selects the fine delayed signal until the external and internal clock signals are synchronized, wherein a number of the fine delay paths is smaller than a number of the delay stages of the coarse delay line.

17. A delay locked loop comprising:

a coarse delay line for applying a coarse delay to an external clock signal to generate a coarse delayed signal;

a plurality of fine delay paths connected to the coarse delay line for applying unequal amounts of fine delay to the coarse delayed signal to generate a plurality of fine delayed signals;

a selector connected to the fine delay paths to select one of the fine delayed signals based on select signals to provide an internal clock signal;

a phase detector to compare the external and internal clock signals to provide shifting signals;

a shift register connected to the phase detector and the selector, the shift register receiving the shifting signals to activate the select signals;

a logic circuit including inputs connected to the shift register and the phase detector to receive the shifting signals and the select signal to provide coarse adjust signals; and a controller connected to the logic circuit to receive the coarse adjust signals to adjust the coarse delay, wherein the coarse controller adjusts the coarse delay and the selector selects the fine delayed signal until the external and internal clock signals are synchronized, wherein the fine delay paths include a plurality of delay elements, wherein each of the delay elements includes two inverters connected in series.

18. A memory device comprising:

a plurality of memory cells;

an output circuit connected to the memory cells; and a delay locked loop (DLL) connected to the output circuit, the DLL comprising:

a coarse delay segment for applying a coarse delay to an external clock signal to generate a coarse delayed signal;

a fine delay segment connected to the coarse delay segment for applying a fine delay to the coarse delayed signal to generate an internal clock signal; and wherein the fine delay segment is configured for adjusting the fine delay based on a plurality of shifting signals that are generated when the external and internal signals are not synchronized, wherein the coarse delay is configured for adjusting the coarse delay based on a combination of the plurality of shifting signals and a plurality of select signals, and wherein the select signals are used to select the fine delay applied to the coarse delay signal.

19. The memory device of claim 18, wherein each time the coarse delay segment adjusts the coarse delay, the fine delay segment changes the fine delay to a different amount of delay within a fine delay range of the fine delay segment.

20. The memory device of claim 18, wherein the output circuit receives the internal clock signal to capture a data signal from the memory cells during a memory operation.

21. The memory device of claim 18 further comprising a data bus, wherein the output circuit receives the internal clock signal to capture a data signal from the memory cells and outputs the data signal to the data bus during a memory operation, wherein the external clock signal and the data signal at the data bus are synchronized.

22. The memory device of claim 18, wherein the DLL further includes a model circuit, the model circuit being connected to the fine delay segment, wherein the model circuit is identical to the output circuit.

23. A memory device comprising:

a plurality of memory cells;

an output circuit connected to the memory cells; and a delay locked loop (DLL) connected to the output circuit, the DLL comprising:

a coarse delay segment for applying a coarse delay to an external clock signal to generate a coarse delayed signal;

a fine delay segment connected to the coarse delay segment for applying a number of unequal amounts of fine delay to the coarse delayed signal to generate a plurality of fine delayed signals having different phase shifts, the fine delay segment including a selector, the selector responsive to a select signal to select from among the fine delay signals to generate an internal clock signal;

a phase detector for generating a plurality of shifting signals based on a difference in phase between the external and internal clock signals, wherein the fine delay segment is configured to provide the select signal based on the plurality of shifting signals; and a logic circuit responsive to the combination of the plurality of shifting signals and the select signal to enable the coarse delay segment to adjust the coarse delay.

24. A memory device comprising:

a plurality of memory cells;

an output circuit connected to the memory cells; and a delay locked loop (DLL) connected to the output circuit, the DLL comprising:

a coarse delay segment for applying a coarse delay to an external clock signal to generate a coarse delayed signal;

a fine delay segment connected to the coarse delay segment for applying a number of unequal amounts of fine delay to the coarse delayed signal to generate a plurality of fine delayed signals having different phase shifts;

a phase detector for generating shifting signals based on a difference in phase between the external and internal clock signals, wherein the fine delay segment is configured to select one of the fine delay signals based on the shifting signals to provide an internal clock signal; and a logic circuit to receive the shifting signals and a select signal to enable the coarse delay segment to adjust the coarse delay, wherein each time the coarse delay segment adjusts the coarse delay, the fine delay segment switches the internal clock signal between two fine delayed signals having unequal amounts of delay within a fine delay range.

25. The memory device of claim 23, wherein the output circuit receives the internal clock signal to capture a data signal from the memory cells during a memory operation.

26. The memory device of claim 23 further comprising a data bus, wherein the output circuit receives the internal clock signal to capture a data signal from the memory cells and outputs the data signal to the data bus during a memory operation, wherein the external clock signal and the data signal at the data bus are synchronized.

27. The memory device of claim 23, wherein the DLL further includes a model circuit, the model circuit being connected to the fine delay segment, wherein the model circuit is identical to the output circuit.

28. A system comprising:
a processor; and
a memory device connected to the processor, the memory device comprising:
  a plurality of memory cells;
  an output circuit connected to the memory cells;
  a delay locked loop (DLL) connected to the output circuit, the DLL comprising:
    a coarse delay segment for applying a coarse delay to an external clock signal to generate a coarse delayed signal;
    a fine delay segment connected to the coarse delay segment for applying a fine delay to the coarse delayed signal to generate an internal clock signal; and
    wherein the fine delay segment is configured for adjusting the fine delay based on a plurality of shifting signals that are generated when the external and internal signals are not synchronized, wherein the coarse delay is configured for adjusting the coarse delay based on a combination of the plurality of shifting signals and a plurality of select signals, and wherein the select signals are used to select the fine delay applied to the coarse delay signal.

29. The system of claim 28, wherein each time the coarse delay segment adjusts the coarse delay, the fine delay segment changes the fine delay to a different amount of delay within a fine delay range of the fine delay segment.

30. The system of claim 28 further comprising a data bus connected between the processor and the memory device, wherein the output circuit receives the internal clock signal to capture a data signal from the memory cells and outputs the data signal to the processor via the data bus during a memory operation, wherein the external clock signal and the data signal at the data bus are synchronized.

31. A system comprising:
a processor; and
a memory device connected to the processor, the memory device comprising:
  a plurality of memory cells;
  an output circuit connected to the memory cells; and
  a delay locked loop (DLL) connected to the output circuit, the DLL comprising:
    a coarse delay segment for applying a coarse delay to an external clock signal to generate a coarse delayed signal;
    a fine delay segment connected to the coarse delay segment for applying a number of unequal amounts of fine delay to the coarse delayed signal to generate a plurality of fine delayed signals having different phase shifts, the fine delay segment including a selector, the selector responsive to a select signal to select from among the fine delay signals to generate an internal clock signal;
    a phase detector for generating a plurality of shifting signals based on a difference in phase between the external and internal clock signals, wherein the fine delay segment is configured to provide the select signal based on the plurality of shifting signals; and
    a logic circuit responsive to the combination of the plurality of shifting signals and the select signal to enable the coarse delay segment to adjust the coarse delay.

32. A system comprising:
a processor; and
a memory device connected to the processor, the memory device comprising:
  a plurality of memory cells;
  an output circuit connected to the memory cells; and
  a delay locked loop (DLL) connected to the output circuit, the DLL comprising:
    a coarse delay segment for applying a coarse delay to an external clock signal to generate a coarse delayed signal;
    a fine delay segment connected to the coarse delay segment for applying a number of unequal amounts of fine delay to the coarse delayed signal to generate a plurality of fine delayed signals having different phase shifts;
    a phase detector for generating shifting signals based on a difference in phase between the external and internal clock signals, wherein the fine delay segment selects one of the fine delay signals based on the shifting signals to provide an internal clock signal; and
    a logic circuit to receive the shifting signals and the select signal to enable the coarse delay segment to adjust the coarse delay, wherein each time the coarse delay segment adjusts the coarse delay, the fine delay segment switches the internal clock signal between two fine delayed signals having unequal amounts of delay within a fine delay range.

33. The system of claim 31 further comprising a data bus connected between the processor and the memory device, wherein the output circuit receives the internal clock signal to capture a data signal from the memory cells and outputs the data signal to the processor via the data bus during a memory operation, wherein the external clock signal and the data signal at the data bus are synchronized.

34. A method of generating a clock signal, the method comprising:
  delaying an external clock signal with a coarse delay to generate a coarse delayed signal;
  applying a fine delay within a fine delay range to the coarse delayed signal to generate an internal clock signal;
  generating shifting signals if the external and internal clock signals are not synchronized;
  adjusting the fine delay based on the shifting signals; and
  adjusting the coarse delay based on both the shifting signals and select signals, wherein the select signals are used to select the fine delay being applied.

35. The method of claim 34 further includes comparing the external and internal clock signals to generate the shifting signals.

36. The method of claim 34, wherein applying a coarse delay includes applying a coarse delay within a coarse delay range, wherein the fine delay range is smaller than the coarse delay range.

37. The method of claim 34, wherein applying a coarse delay includes applying a coarse delay within a coarse delay range, wherein a maximum delay of the fine delay range is smaller than a minimum delay of the coarse delay range.

38. The method of claim 34, wherein adjusting the fine delay includes applying a different amount of fine delay within the fine delay range, wherein a largest amount of delay of the fine delay range is smaller than a smallest amount of delay of a coarse delay range of the coarse delay segment.

39. The method of claim 34, wherein adjusting the coarse delay includes changing the fine delay between different amounts of delay of the fine delay range.

40. The method of claim 34, wherein adjusting the coarse delay includes increasing the coarse delay only when the fine delay is equal to a largest amount of delay of the fine delay range and the shifting signals indicate an increase in delay is necessary.

41. The method of claim 34, wherein adjusting the coarse delay includes decreasing the coarse delay only when the fine delay is equal to a smallest amount of delay of the fine delay range and the shifting signals indicate a decrease in delay is necessary.

42. A method of generating a clock signal, the method comprising:

applying a coarse delay within coarse delay range to an external clock signal to generate a coarse delayed signal;

applying unequal amounts of fine delay within a fine delay range to the coarse delayed signal to generate a plurality of fine delayed signals;

selecting one of the fine delay signals to be an internal clock signal generating shifting signals based on a difference in phase between the external and internal clock signals;

adjusting the fine delay in response to the shifting signals; and adjusting the coarse delay in response to both the shifting signals and select signals, wherein the select signals are used to select the unequal amounts of fine delay applied to the coarse delayed signal.

43. The method of claim 42, wherein applying a coarse delay includes applying a coarse delay within a coarse delay range, wherein the fine delay range is smaller than the coarse delay range.

44. The method of claim 42, wherein selecting a fine delayed signal includes activating a select signal based on the shifting signal to select one of the fine signals.

\* \* \* \* \*